United States Patent [19]

Nishimura et al.

[11] Patent Number: 5,689,819
[45] Date of Patent: Nov. 18, 1997

[54] TRANSMITTER-RECEIVER

[75] Inventors: Shuji Nishimura; Kenji Itoh, both of Tokyo, Japan

[73] Assignee: Mitsubishi Denki Kabushiki Kaisha, Japan

[21] Appl. No.: 562,066

[22] Filed: Nov. 22, 1995

[30] Foreign Application Priority Data

Jun. 5, 1995 [JP] Japan ................. 7-137998

[51] Int. Cl.$^6$ ................................... H04B 1/40
[52] U.S. Cl. ............................. 455/86; 455/78
[58] Field of Search ..................... 455/78, 79, 82, 455/83, 84, 85, 86, 87, 310

[56] References Cited

U.S. PATENT DOCUMENTS

| | | | |
|---|---|---|---|
| 2,903,693 | 1/1959 | Ley | 455/78 |
| 4,373,205 | 2/1983 | Mizota . | |
| 5,123,008 | 6/1992 | Beesley | 455/86 |
| 5,276,915 | 1/1994 | Marko et al. | 455/86 |
| 5,307,378 | 4/1994 | Norimatsu | 455/87 |
| 5,471,652 | 11/1995 | Hulkko | 455/76 |
| 5,483,679 | 1/1996 | Sasaki | 455/86 |

FOREIGN PATENT DOCUMENTS

| | | |
|---|---|---|
| 0246658 | 11/1987 | European Pat. Off. . |
| 4-133508 | 5/1992 | Japan . |
| 93/16530 | 8/1993 | WIPO . |
| 96/05661 | 2/1996 | WIPO . |

*Primary Examiner*—Chi H. Pham
*Attorney, Agent, or Firm*—Rothwell, Figg, Ernst & Kurz, P.C.

[57] ABSTRACT

In a transmitter-receiver having a transmitting circuit and a receiving circuit, the present invention mitigates an interference between the transmitting circuit and the receiving circuit. A quartz-crystal oscillator is provided as a common reference signal source for the local oscillators and the relation among frequencies is determined so that the frequencies such as local oscillating frequencies and intermediate frequencies within the transmitter-receiver do not overlap each other. Interferences between the transmitting circuit and the receiving circuit are mitigated to prevent a characteristic deterioration, spurious radiation, etc. Thereby the transmitter-receiver may be reduced in size and weight. Further, by sharing a quartz-crystal oscillator having a high frequency stability, narrowing of bands in radio channel spacing may be readily achieved.

7 Claims, 8 Drawing Sheets

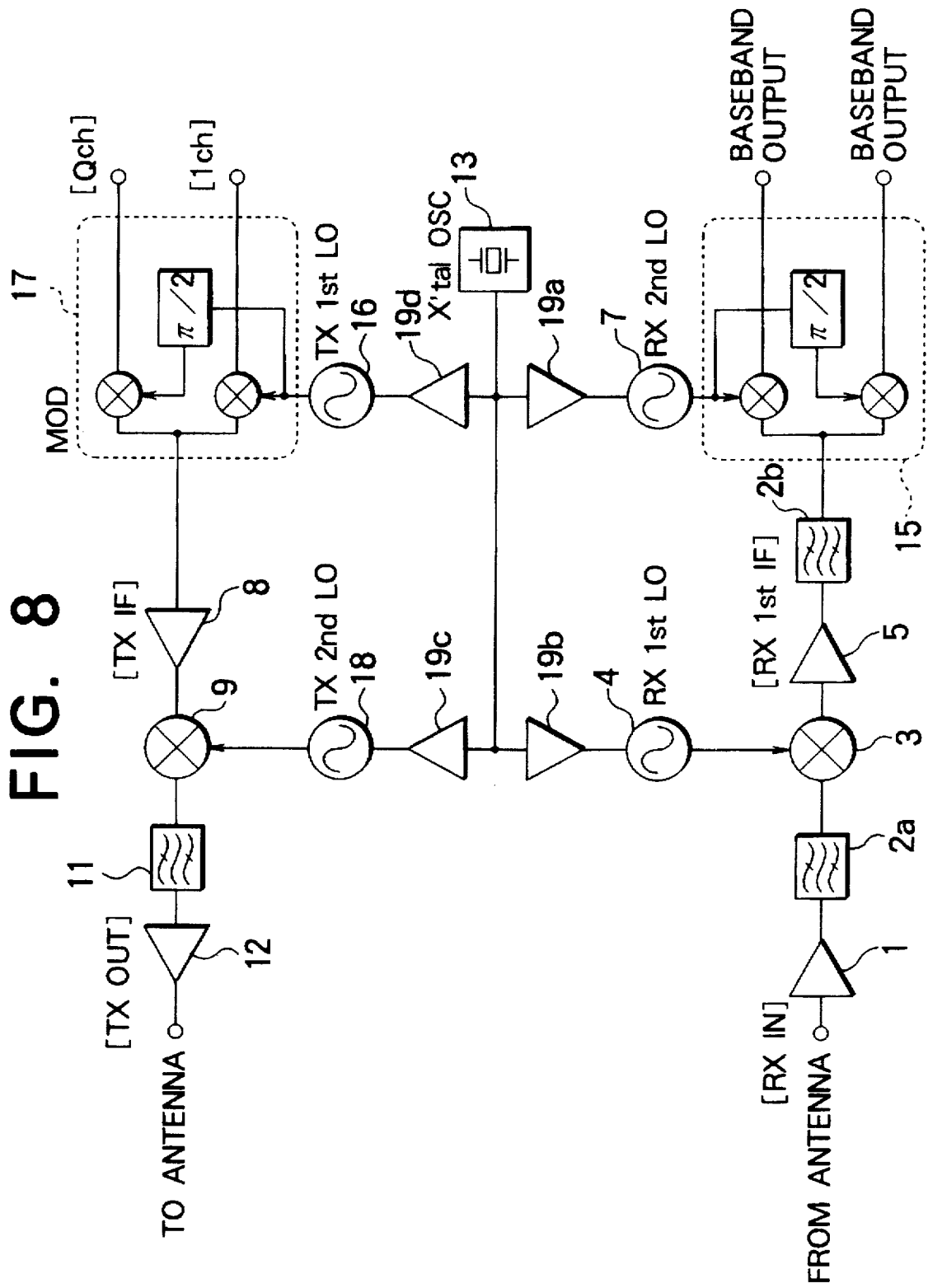

TRANSMITTER-RECEIVER

BACKGROUND OF THE INVENTION

1. Field of the Invention

This invention relates to transmitter-receivers and, more particularly, relates to a transmitter-receiver to be used in such mobile communications as a satellite communication, mobile phone, portable telephone, etc.

2. Description of the Related Art

A transmitter-receiver generally has a transmitting circuit for effecting a transmission processing of a sound information, data, etc., through an antenna, and a receiving circuit for effecting a reception processing of a sound information, data, etc., through an antenna.

Since the transmitting circuit and the receiving circuit are to process an information, etc., independently from each other, it is desirable that they do not interfere with each other.

However, if a transmitting circuit and a receiving circuit are located closely to each other, a mutual interference may occur due to a sneaking-in of a transmitting wave into the receiving circuit or of a receiving wave into the transmitting circuit.

Especially, since the reduction in size and weight is demanded of a transmitter-receiver to be used in such mobile communications as a satellite communication, mobile phone and portable portable telephone from the viewpoint of its mounting space and portability, it is inevitable that the transmitting circuit and the receiving circuit be located close to each other.

Further, since, in the satellite communication, for example, there is a difference in the level of 150 dB or more exists between the transmitting power and the receiving power, a problem of deterioration in the receiving wave input from the antenna occurs if a transmitting wave at a high level sneaks in the receiving circuit, though a problem is not likely to occur even if a receiving wave at a relatively low level sneaks in the transmitting circuit.

For this reason, in a conventional terminal for a satellite communication or the like, the transmitting circuit and receiving circuit are formed on different boards and are provided with a sufficient shield.

If there is a need for further suppressing an interference between the transmitting circuit and the receiving circuit, the transmitting circuit and the receiving circuit are mounted on different cases from each other. As a result, it has been impossible to satisfy the demand for the reduction in size and weight.

In addition, narrowing of bands for the radio channel spacing is necessary from the viewpoint of effective utilization of frequencies, and a development of a low price transmitter-receiver achieving these by a simple construction is in demand.

On the other hand, in order to achieve the narrowing of bands for the radio channel spacing, a filter having a steep damping characteristic for suppressing an interference between neighboring channels is necessary. Therefore, circuit construction of the transmitter-receiver becomes complicated, resulting in problems such as an increase in price of the transmitter-receiver.

As the above, the conventional transmitter-receiver has a problem that, when the transmitting circuit and the receiving circuit are located closely to each other in order to reduce the size and weight thereof, they interfere with each other. This problem is notable especially when the transmitting circuit and the receiving circuit are constructed on the same board or mounted on the same case.

SUMMARY OF THE INVENTION

This invention has been made to eliminate the problems as described above and its object is to mitigate an interference between the transmitting circuit and the receiving circuit in a transmitter-receiver.

A transmitter-receiver according to this invention comprises: a transmitting local oscillator for generating a transmitting oscillation signal having a transmitting local oscillating frequency based on a reference signal; a transmitting circuit for providing an output by converting frequency of a transmitted signal input thereto in accordance with said transmitting oscillation signal; a receiving local oscillator for generating a receiving oscillation signal having a receiving local oscillating frequency based on said reference signal; a receiving circuit for providing an output by converting frequency of a received signal input thereto in accordance with said receiving oscillation signal; and a reference signal oscillator provided as a common reference signal source for supplying said reference signal to said transmitting local oscillator and to said receiving local oscillator; wherein a frequency arrangement of said transmitting local oscillating frequency, frequency of signals existing within said transmitting circuit, said receiving local oscillating frequency and frequency of signals existing within said receiving circuit being set such that the frequencies of the signals existing within the transmitter-receiver avoid overlapping one another.

In the transmitter-receiver according to this invention, a frequency arrangement of said transmitting local oscillating frequency, frequency of signals existing within said transmitting circuit, said receiving local oscillating frequency and frequency of signals existing within said receiving circuit is set such that a transmitting image frequency of a signal within said transmitting circuit and frequencies of signals within said receiving circuit avoid overlapping each other.

In the transmitter-receiver according to this invention, a frequency arrangement of said transmitting local oscillating frequency, frequency of signals existing within said transmitting circuit, said receiving local oscillating frequency and frequency of signals existing within said receiving circuit is set such that a receiving image frequency of a signal within said receiving circuit and frequencies of signals within said transmitting circuit avoid overlapping each other.

In the transmitter-receiver according to this invention, said transmitting circuit comprises: a transmitting intermediate amplifier for amplifying a transmitted signal input as having a transmitting intermediate frequency; a transmitting mixer for providing an output by mixing an output from the transmitting intermediate amplifier and an output of said transmitting local oscillator to effect a frequency conversion thereof from the transmitting intermediate frequency to a predetermined transmitting frequency; a transmitting band-pass filter for removing unnecessary wave components from the output of the transmitting mixer; and a transmitting power amplifier for amplifying an output of the transmitting band-pass filter and delivering it to an antenna.

In the transmitter-receiver according to this invention, said receiving local oscillator comprises: a receiving first local oscillator for generating a receiving oscillation signal having a receiving first local oscillating frequency based on said reference signal; and a receiving second local oscillator for generating a receiving oscillation signal having a receiving second local oscillating frequency based on said reference signal; and wherein said receiving circuit comprises: a low-noise amplifier for amplifying a received wave input from an antenna; a receiving first band-pass filter for removing unnecessary wave components from an output of the low-noise amplifier; a receiving first mixer for mixing an output of the receiving first band-pass filter and the output of said receiving first local oscillator to provide an output by converting the receiving frequency into a receiving first intermediate frequency; a receiving first intermediate amplifier for amplifying the output of the receiving first mixer; a receiving second band-pass filter for removing unnecessary wave components from an output of the receiving first intermediate amplifier; and a receiving second mixer means for mixing an output of the receiving second band-pass filter and an output of said receiving second local oscillator to provide an output by converting the receiving first intermediate frequency into a receiving second intermediate frequency.

In the transmitter-receiver according to this invention, further comprising damping means for damping a leakage signal provided between said transmitting local oscillator and said receiving first and second local oscillators.

In the transmitter-receiver according to this invention, buffer means are provided as said damping means respectively between said reference signal oscillator and said transmitting local oscillator, between said reference signal oscillator and said receiving first local oscillator, and between said reference signal oscillator and said receiving second local oscillator.

In the transmitter-receiver according to this invention, a buffer amplifier is used as said buffer means.

In the transmitter-receiver according to this invention, an isolator is used as said buffer means.

In the transmitter-receiver according to this invention, a quasi-synchronization detector circuit is used as said receiving second mixer means.

In the transmitter-receiver according to this invention, while a transmitting local oscillator for outputting a transmitting oscillation signal to said transmitting mixer is provided as a transmitting second local oscillator, a transmitting first local oscillator having a transmitting local oscillating frequency different from the transmitting second local oscillator is provided as said transmitting local oscillator; and further comprising an orthogonal converter receiving an output of the transmitting first local oscillator and a baseband signal for outputting a transmitted signal having a modulated intermediate frequency to said transmitting intermediate amplifier.

In the transmitter-receiver according to this invention, a buffer amplifier is provided between said reference signal oscillator and said transmitting first local oscillator.

In the transmitter-receiver according to this invention, a quasi-synchronization detector circuit is used as said receiving second mixer means.

BRIEF DESCRIPTION OF THE DRAWINGS

FIG. 8 is a schematic diagram illustrating the construction of a transmitter-receiver according to Embodiment 7.

DESCRIPTION OF THE PREFERRED EMBODIMENT

Embodiment 1

A description will now be given by way of FIG. 1 and FIG. 2 with respect to a transmitter-receiver according to the invention of Embodiment 1.

In this embodiment, a terminal for a satellite communication is used as the transmitter-receiver.

Figure 1:
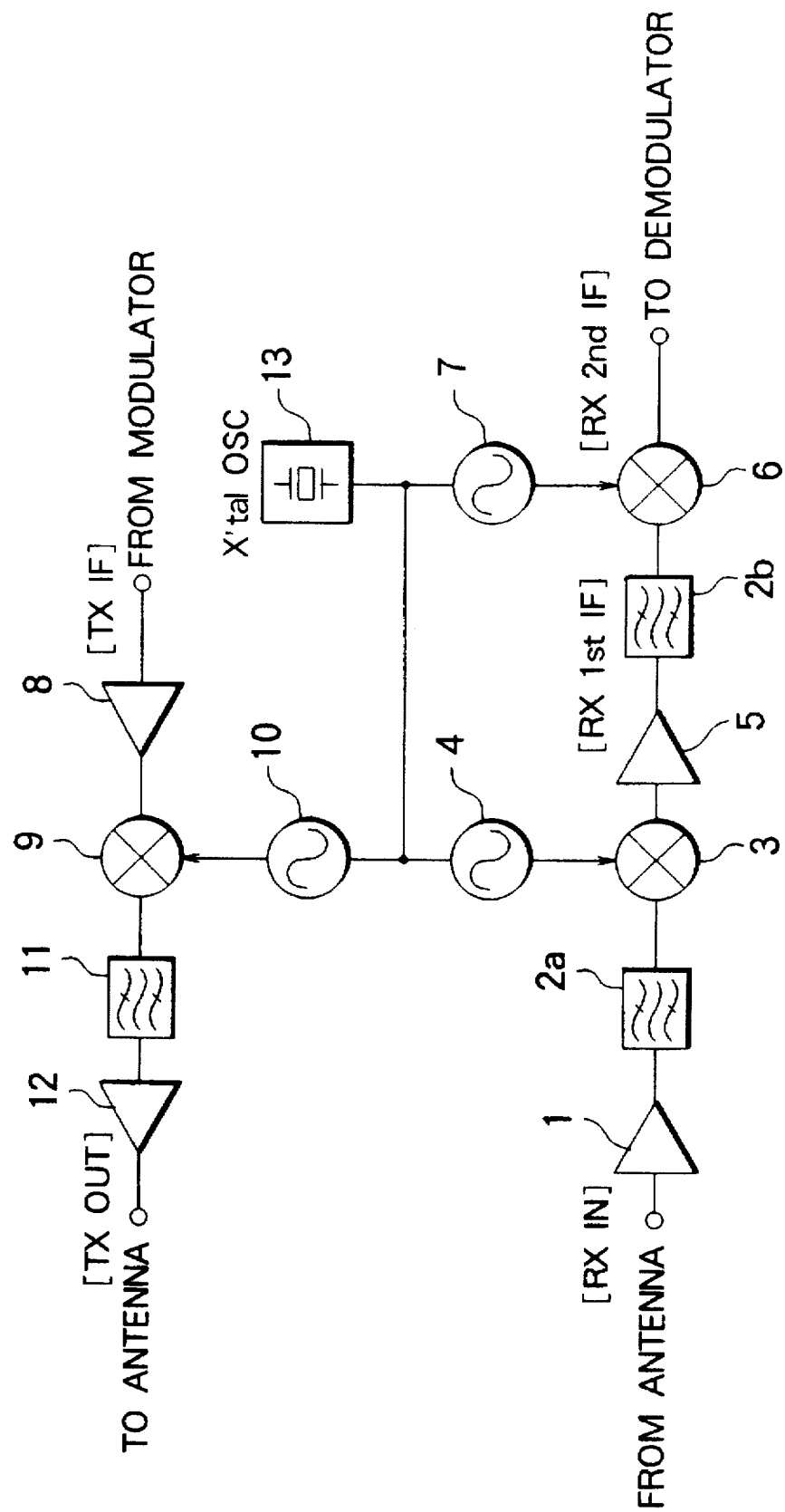
FIG. 1 is a schematic diagram illustrating the construction of a transmitter-receiver according to Embodiment 1.

Referring to FIG. 1, denoted by numeral: 1 is a low-noise amplifier to which a signal output from an antenna (not shown) is input; 2a is a receiving band-pass filter which is connected to an output side of the low-noise amplifier and to which an output signal of the low-noise amplifier 1 is input; and 3 is a receiving first mixer connected to an output side of the receiving band-pass filter 2a and to an output side of a receiving first local oscillator 4.

Denoted by numeral: 5 is a receiving first intermediate amplifier connected to an output side of the receiving first mixer 3; 2b is a receiving band-pass filter connected to an output side of a receiving first intermediate amplifier 5; and 6 is a receiving second mixer connected to an output side of the receiving band-pass filter 2b and to an output side of a receiving second local oscillator 7, an output signal thereof being output to a demodulator.

Further, denoted by numeral: 8 is a transmitting intermediate amplifier to which a modulated signal output from a modulator (not shown) is input; 9 is a transmitting mixer connected to an output side of the transmitting intermediate amplifier 8 and to an output side of a transmitting local oscillator 10; 11 is a transmitting band-pass filter connected to an output side of the transmitting mixer 9; 12 is a transmitting power amplifier connected to an output side of the transmitting band-pass filter 11; and 13 is a quartz-crystal oscillator an output of which being connected to the receiving first local oscillator 4, to the receiving second local oscillator 7 and to the transmitting local oscillator 10.

In this embodiment, a receiving circuit is constituted by the low-noise amplifier 1, receiving band-pass filter 2a, receiving first mixer 3, receiving first local oscillator 4, receiving first intermediate amplifier 5, receiving band-pass filter 2b, receiving second mixer 6 and receiving second local oscillator 7.

Further, a transmitting circuit is constituted by the transmitting intermediate amplifier 8, transmitting mixer 9, transmitting local oscillator 10, transmitting band-pass filter 11 and transmitting power amplifier 12.

Operation of the receiving circuit will now be described.

A received wave input from the antenna is amplified at the low-noise amplifier 1 and is removed of unnecessary wave components at the receiving band-pass filter 2a. An output from the receiving band-pass filter 2a is mixed with an output signal from the receiving first local oscillator 4 having a first local oscillating frequency (RX 1st LO) at the receiving first mixer 3 so that it is subjected to a frequency conversion from a received frequency (RX) to a receiving first intermediate frequency (RX 1st IF).

An output signal of the receiving first mixer 3 having the receiving first intermediate frequency is amplified at the receiving first intermediate amplifier 5 and is furthermore removed of unnecessary frequency components at the receiving band-pass filter 2b. An output signal of the receiving band-pass filter 2b is mixed with an output signal of the receiving second local oscillator 7 having a second local oscillating frequency (RX 2nd LO) so as to be subjected to a frequency conversion from the receiving first intermediate frequency (RX 1st IF) to a receiving second intermediate frequency (RX 2nd IF) and thereafter is output to the demodulator.

An output signal from the quartz-crystal oscillator 13 is input to the receiving first local oscillator 4 and to the receiving second local oscillator 7.

Operation of the transmitting circuit will now be described.

A transmitted signal having a transmitting intermediate frequency (TX IF) input from the modulator is amplified at the transmitting intermediate amplifier 8. An output signal of the transmitting intermediate amplifier 8 is mixed with an output signal of the transmitting local oscillator 10 having a transmitting local frequency (TX LO) to be converted from the transmitting intermediate frequency (TX IF) to a transmitting frequency (TX). Thereafter, it is removed of unnecessary frequency components at the transmitting band-pass filter 11 and is amplified at the transmitting power amplifier 12 to be delivered to the antenna.

An output signal from the quartz-crystal oscillator 13 is input to the transmitting local oscillator 10.

In other words, the circuit construction is such that the receiving first local oscillator 4, receiving second local oscillator 7 and the transmitting local oscillator 10 are not individually provided with a separate quartz-crystal oscillator, but they are operated by sharing the quartz-crystal oscillator 13 as their common reference signal source.

In this manner, since a common quartz-crystal oscillator is provided for supplying an oscillation signal to the respective local oscillators, it helps a reduction in size of the apparatus and spurious output due to an interference between quartz-crystal oscillators is less likely comparing to the case of providing an individual quartz-crystal oscillator for each circuit. On the other hand, since, in the conventional construction, a plurality of quartz-crystal oscillators are disposed so that one is provided for each local oscillator, all of the plurality of quartz-crystal oscillators have been required to be of high quality in order to improve the accuracy of the transmitting and receiving frequencies in the system as a whole.

By contrast, since, in the present embodiment, a common quartz-crystal oscillator for providing a reference signal for the respective local oscillators, accuracy of the transmitting and receiving frequencies may be improved for the system as a whole whenever the shared quartz-crystal oscillator is of a high quality.

By using a quartz-crystal oscillator having a very high frequency stability, narrowing of bands for radio channel spacing may readily be achieved.

In this manner, signals respectively having the receiving frequency (RX), first local oscillating frequency (RX 1st LO), receiving first intermediate frequency (RX 1st IF), second local oscillating frequency (RX 2nd LO), receiving second intermediate frequency (RX 2nd IF) exist in the receiving circuit.

On the other hand, signals respectively having the transmitting frequency (TX), transmitting local frequency (TX LO) and transmitting intermediate frequency (TX IF) exist in the transmitting circuit.

Further, signals having a receiving image frequency (RX IMG) and a transmitting image frequency (TX IMG) also exist in the two circuits, respectively.

Here, the receiving image frequency (RX IMG) is a frequency separated by an amount corresponding to the intermediate frequency from the first local oscillating frequency (RX 1st LO) in the direction opposite to the receiving frequency which is a desired signal frequency. It may be expressed by an equation as follows:

$$(RX\ IMG) = (RX\ 1st\ LO) - (RX\ 1st\ IF)$$

Since this receiving image frequency (RX IMG) is subject to a frequency conversion into the receiving first intermediate frequency (RX 1st IF) which is the same as the desired signal by a frequency conversion by the receiving first mixer 3, it becomes a signal which interferes with the desired signal.

Similarly, the transmitting image frequency (TX IMG) may also be expressed by an equation as follows:

$$(TX\ IMG) = (TX\ LO) - (TX\ IF)$$

Frequencies of the signals existing in the transmitter-receiver according to this embodiment will now be described by way of FIG. 2.

In this figure, denoted by numeral: 20 is a receiving second intermediate frequency; 21 is a receiving first intermediate frequency; 22 is a transmitting intermediate frequency; 23 is a transmitting image frequency; 24 is a receiving image frequency; 25 is a transmitting local frequency; 26 is a receiving local frequency; 27 is a receiving frequency; and 28 is a transmitting frequency.

In this embodiment, the frequency arrangement within the transmitter-receiver is determined so that the frequencies of the signals existing within the transmitter-receiver do not overlap each other. In this manner, since frequencies do not overlap even when a signal in the transmitting circuit or a signal in the receiving circuit sneaks into the other, the degree of interference with each other is mitigated and problems such as of deterioration in characteristic and spurious radiation do not occur.

Especially, since not only the receiving first intermediate frequency and receiving second intermediate frequency but also the receiving image frequency is noticed to avoid an overlapping on the transmitting frequency and transmitting local oscillating frequency band, the problems such as of deterioration in characteristic and spurious radiation may be effectively solved.

Further, since not only the transmitting first intermediate frequency but also the transmitting image frequency is noticed to avoid an overlapping on the receiving frequency and receiving first local oscillating frequency band, the problems such as of deterioration in characteristic and spurious radiation may be effectively solved.

The quartz-crystal oscillator 13 in the present embodiment is constructed to have a frequency arrangement capable of outputting a desired local oscillating frequency band as described above.

As the above, since, in the transmitter-receiver according to Embodiment 1, the transmitting local oscillator, transmitting circuit, receiving local oscillator and receiving circuit are controlled such that the frequencies of signals within the transmitting circuit and the frequencies of signals within the receiving circuit do not overlap each other, an interference by the signals within the transmitting circuit with the signals within the receiving circuit is mitigated and an interference by the signals within the receiving circuit with the signals within the transmitting circuit is also mitigated, achieving an advantage that the transmitter-receiver may be reduced in size and weight without causing the problems such as of deterioration in characteristic and spurious radiation. Further, since the transmitting circuit and the receiving circuit share a common oscillator, a spurious output due to an interference between oscillators is eliminated.

Especially, since the circuit construction as described above is provided at a terminal of a satellite communication where the difference of the transmitting power level from the receiving power level is 150 dB or more, the sneaking in of a transmitted wave into the receiving circuit is effectively prevented.

Embodiment 2

A description will now be given by way of FIG. 3 with respect to a transmitter-receiver according to the invention as disclosed in Embodiment 2.

Figure 3:
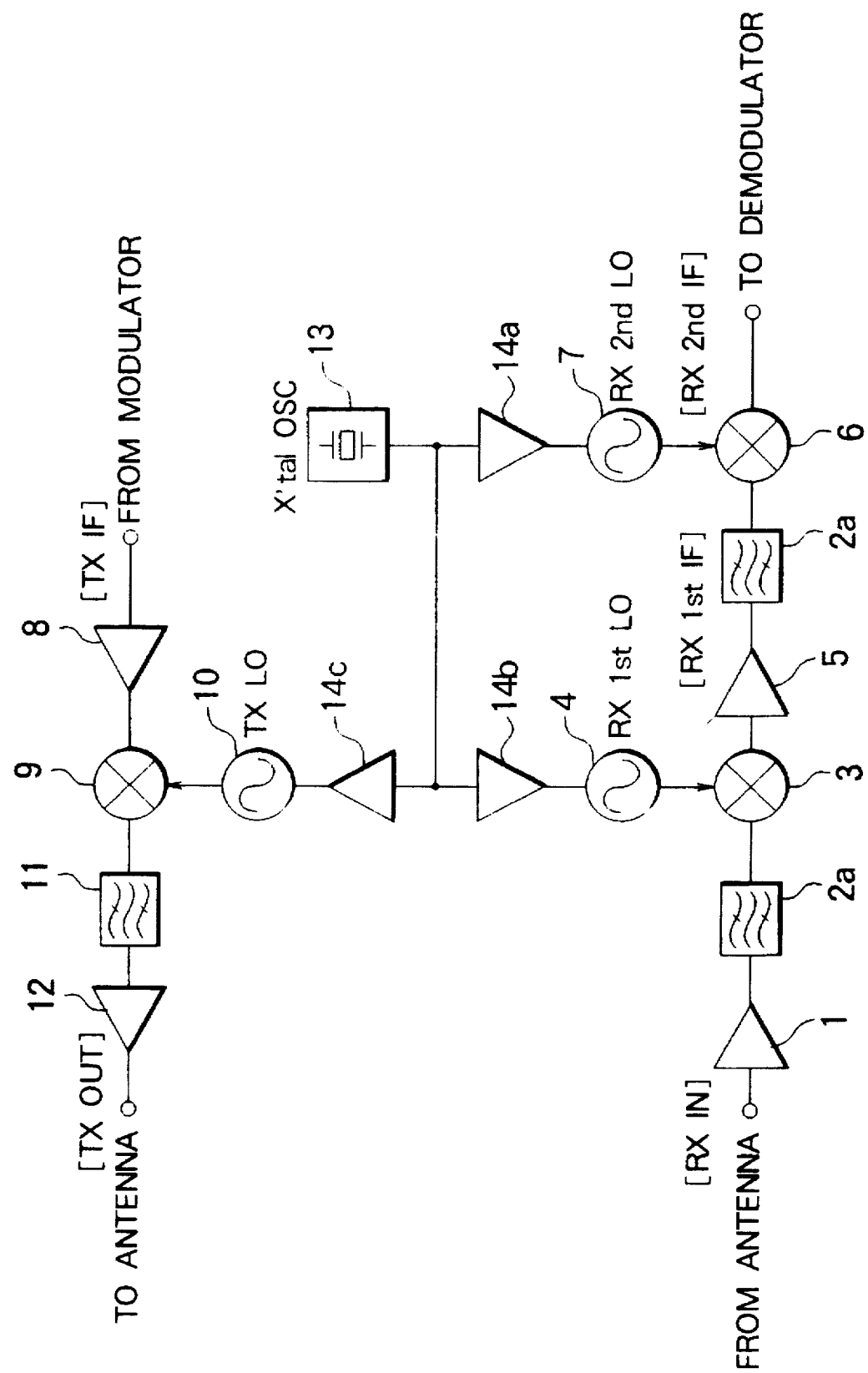
FIG. 3 is a schematic diagram illustrating the construction of a transmitter-receiver according to Embodiment 2.

Referring to FIG. 3, the portions identical or corresponding to those in FIG. 1 are denoted by the same reference numerals and description thereof will be omitted. In the figure, denoted by numeral: 14a is a buffer amplifier connected to an output side of a quartz-crystal oscillator 13 and to an input side of a receiving second local oscillator 7; 14b is a buffer amplifier connected to the output side of the quartz-crystal oscillator 13 and to an input side of a receiving first local oscillator 4; and 14c is an buffer amplifier connected to the output side of the crystal oscillator 13 and to an input side of a transmitting local oscillator 10.

Operation thereof will now be described.

The output of the quartz-crystal oscillator 13 which is used in common is supplied to the receiving second local oscillator 7 via the buffer amplifier 14a, to the receiving first local oscillator 4 via the buffer amplifier 14b, and to the transmitting local oscillator 10 via the buffer amplifier 14c, respectively. The signals respectively input to the buffer amplifiers 14a, 14b, 14c are amplified and output therefrom. The signals supplied to the respective local oscillators are processed in a similar manner as in Embodiment 1.

While the respective local oscillators supply oscillating signals to a mixer, etc., in accordance with the output from the quartz-crystal oscillator, the signals from the mixer, etc., may cause the local oscillators to produce a backward leakage through the signal lines.

Since the buffer amplifiers 14a, 14b, 14c sufficiently damp such backwardly leaked signals by means of isolation thereof, a mutual interference between the circuits may be adequately suppressed.

While, in this embodiment, the buffer amplifiers are provided on the input sides of all the local oscillators, it is not limited to such and an advantage of suppressing a mutual interference between the circuits is achieved by providing one at the input side of any one of these.

As the above, in the transmitter-receiver according to Embodiment 2, signals leaked from the transmitting local oscillator to the receiving local oscillator or from the receiving local oscillator to the transmitting local oscillator are damped by the damping means for damping leaked signals provided between the transmitting local oscillator and the receiving local oscillator, thereby achieving an advantage that the transmitter-receiver may be reduced in size and weight without causing the problems such as of deterioration in characteristic and spurious radiation. Further, since the transmitting circuit and the receiving circuit share a common oscillator, a spurious output due to an interference between oscillators is eliminated.

Embodiment 3

It should be noted that, while one having the buffer amplifier 14 provided at the output of the common quartz-crystal oscillator 13 is shown in the above described embodiment, a similar advantage may be achieved by providing an isolator instead of the buffer amplifier 14.

Embodiment 4

Figure 4:
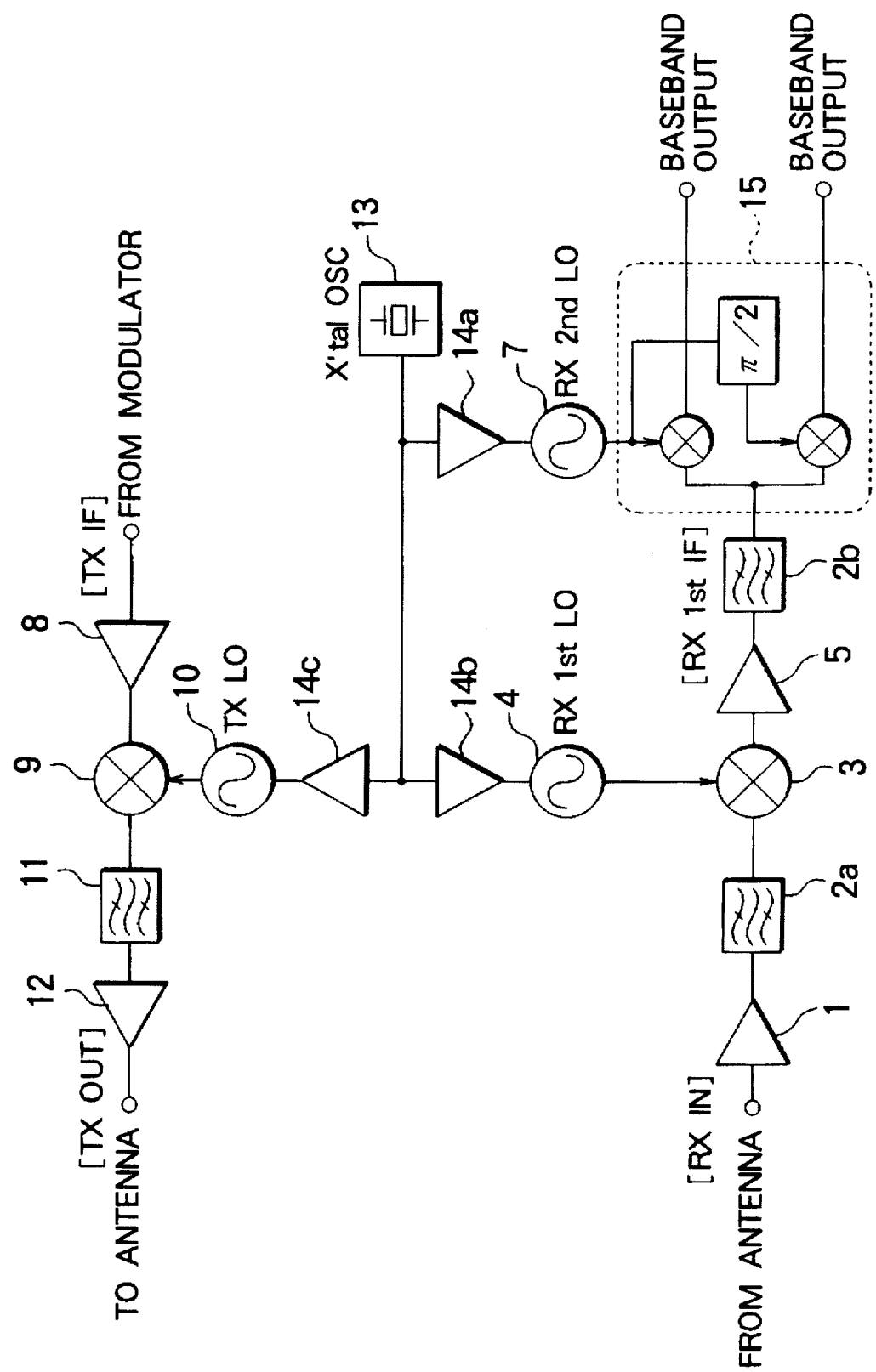
FIG. 4 is a schematic diagram illustrating the construction of a transmitter-receiver according to Embodiment 4.

A description will now be given by way of FIG. 4 with respect to a transmitter-receiver according to the invention as disclosed in Embodiment 4. Referring to FIG. 4, the portions identical or corresponding to those in FIG. 1 and FIG. 2 are denoted by the same reference numerals and description thereof will be omitted. In the figure, numeral 15 denotes a quasi-synchronization detector circuit connected to an output side of the receiving second local oscillator 7.

Operation thereof will now be described.

The signal output from the quartz-crystal oscillator 13 is amplified by the input buffer amplifier 14a and is input to the receiving second local oscillator 7. The output from the receiving second local oscillator 7 is input to the quasi-synchronization detector circuit 15 and is branched thereat into one which is input to a mixer and the other which is input to a mixer after a 2 phase conversion. Baseband signals are then output from the respective mixers.

Especially, in this embodiment, since the received signal having a receiving first intermediate frequency is output as directly converted into baseband, the construction is simple and reduction in size and price may be achieved.

Embodiment 5

Figure 5:
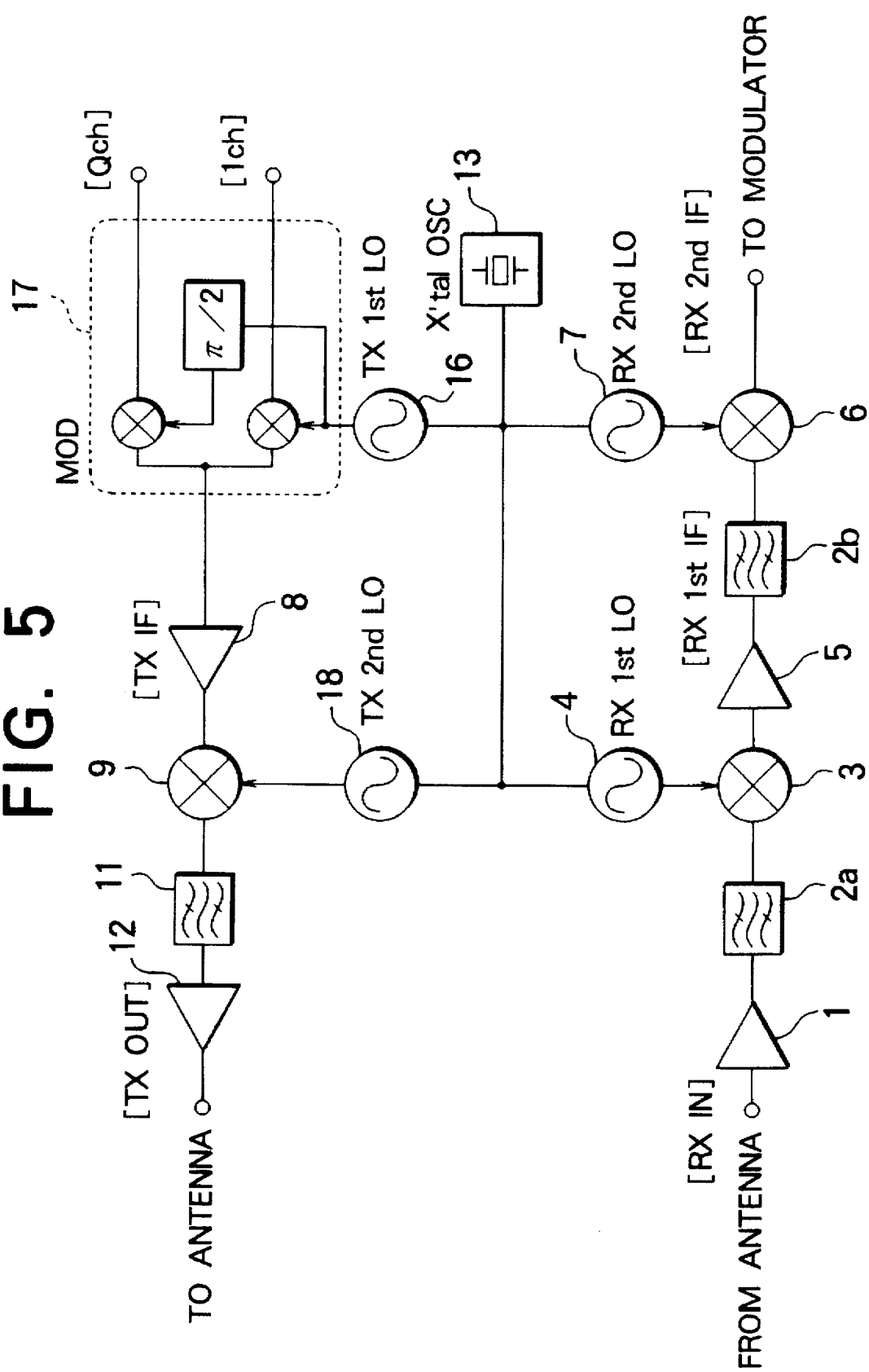
FIG. 5 is a schematic diagram illustrating the construction of a transmitter-receiver according to Embodiment 5.

A description will now be given by way of FIG. 5 with respect to a transmitter-receiver according to the invention as disclosed in Embodiment 5. Referring to FIG. 5, the portions identical or corresponding to those in FIG. 1 and FIG. 2 are denoted by the same reference numerals and description thereof will be omitted. In the figure, denoted by numeral: 16 is a transmitting first local oscillator connected to an output side of the quartz-crystal oscillator 13; 17 is an orthogonal modulator connected to an output side of the transmitting first local oscillator 16; and 18 is a transmitting second local oscillator connected to an output side of the quartz-crystal oscillator 13.

Operation of the receiving circuit will now be described.

A received wave input from the antenna is amplified at the low-noise amplifier 1 and is removed of unnecessary wave components at the receiving band-pass filter 2a. The output of the receiving band-pass filter 2a is mixed with an output signal from the receiving first local oscillator 4 having a first local oscillating frequency (RX 1st LO) at the receiving first mixer 3 to be subjected to a frequency conversion from a receiving frequency (RX) to a receiving first intermediate frequency (RX 1st IF).

An output signal of the receiving first mixer 3 having the receiving first intermediate frequency is amplified at the receiving first intermediate amplifier 5 and moreover is removed of unnecessary wave components at the receiving band-pass filter 2b. The output signal of the receiving band-pass filter 2b is mixed with an output signal of the receiving second local oscillator 7 having a second local oscillating frequency (RX 2nd LO) to be subjected to a frequency conversion from the receiving first intermediate frequency (RX 1st IF) to a receiving second intermediate frequency (RX 2nd IF) and is then output to the demodulator.

An output signal from the quartz-crystal oscillator 13 is input to the receiving first local oscillator 4 and to the receiving second local oscillator 7.

Operation of the transmitting circuit will now be described.

A signal having a first local oscillating frequency output from the transmitting first local oscillator 16 and a baseband signal (Ich,Qch) are input to a modulator 17, thereby a transmitted signal having a modulated intermediate frequency (TX IF) is obtained. This transmitted signal is then amplified at the transmitting intermediate amplifier 8. The output signal of the transmitting intermediate amplifier 8 is mixed with the output signal of the transmitting local oscillator 18 having a transmitting second local frequency (TX 2nd LO) to be subjected to a frequency conversion from the transmitting intermediate frequency (TX IF) to a transmitting frequency (TX). Thereafter, it is removed of unnecessary frequency components at the transmitting band-pass filter 11 and is amplified at the transmitting power amplifier 12 to be delivered to the antenna.

An output signal from the quartz-crystal oscillator 13 is input to the receiving first local oscillator 4 and to the receiving second local oscillator 7.

Figure 6:
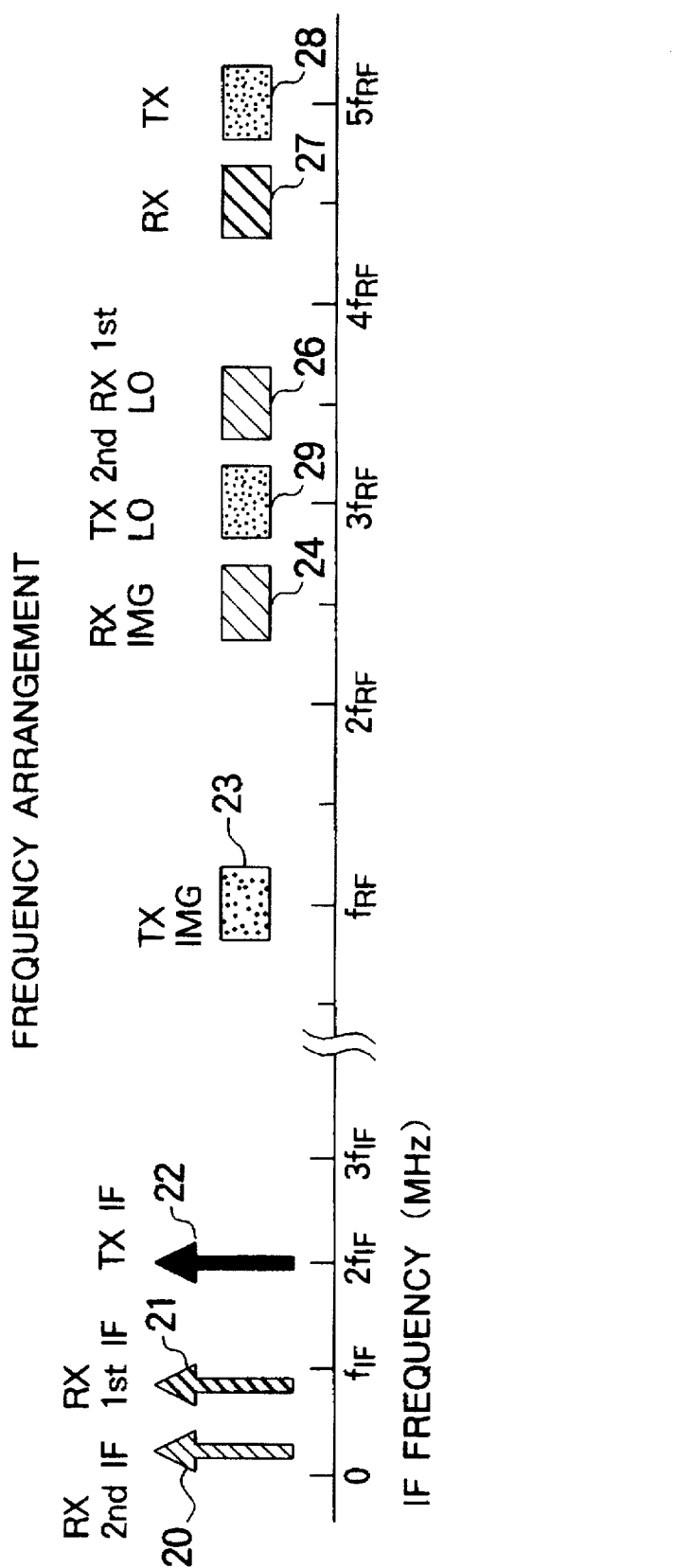
FIG. 6 is a schematic representation illustrating a frequency arrangement within a transmitter-receiver according to Embodiment 5.

Frequencies of the signals existing in the transmitter-receiver according to this invention will now be described by way of FIG. 6.

Figure 2:
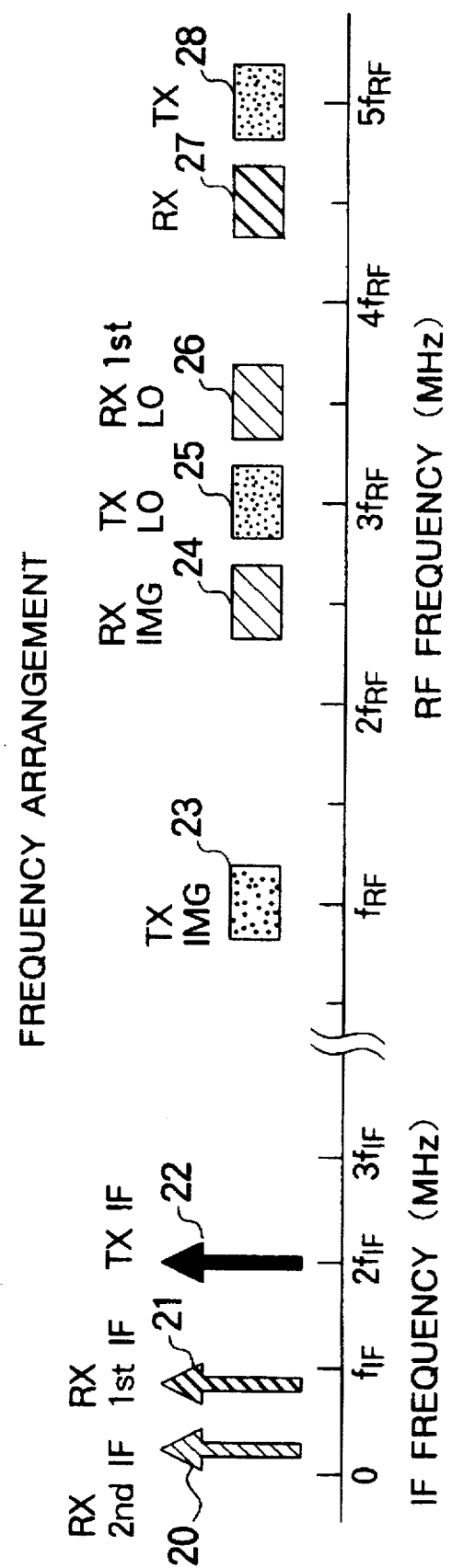
FIG. 2 is a schematic representation illustrating a frequency arrangement within the transmitter-receiver according to Embodiment 1.

In the figure, numerals 20 to 24, 26 to 28 denote identical or corresponding portions as in FIG. 2 and will not be described. Numeral 29 denotes a transmitting second local oscillating frequency.

In this embodiment, frequency arrangement within the transmitter-receiver is determined so that the respective frequencies of the signals existing in the transmitter-receiver do not overlap each other. In this manner, since the frequencies do not overlap even when a signal within one of the transmitting circuit or the receiving circuit sneaks into the other, degree of mutual interference is mitigated and such problems as deterioration in characteristic and spurious radiation do not occur.

Especially, since not only the receiving first intermediate frequency and receiving second intermediate frequency but also the receiving image frequency is noticed to avoid an overlapping on the transmitting frequency and the transmitting local oscillating frequency band, the problems such as deterioration in characteristic and spurious radiation do not occur.

Further, since not only the transmitting first intermediate frequency but also the transmitting image frequency is noticed to avoid an overlapping on the receiving frequency and the receiving first local oscillating frequency band, the problems such as deterioration in characteristic and spurious radiation do not occur.

Especially, in the present embodiment, the frequency arrangement within the transmitter-receiver is determined by selecting the intermediate frequency, i.e., the first local frequency for transmitting operation such that the transmitting second local oscillating frequency and transmitting image frequency do not overlap the receiving frequency and the receiving first local oscillating frequency band.

In the transmitter-receiver according to this embodiment, since a signal having the transmitting intermediate frequency is directly modulated, the construction becomes simple and a reduction in size is possible.

Embodiment 6

Figure 7:
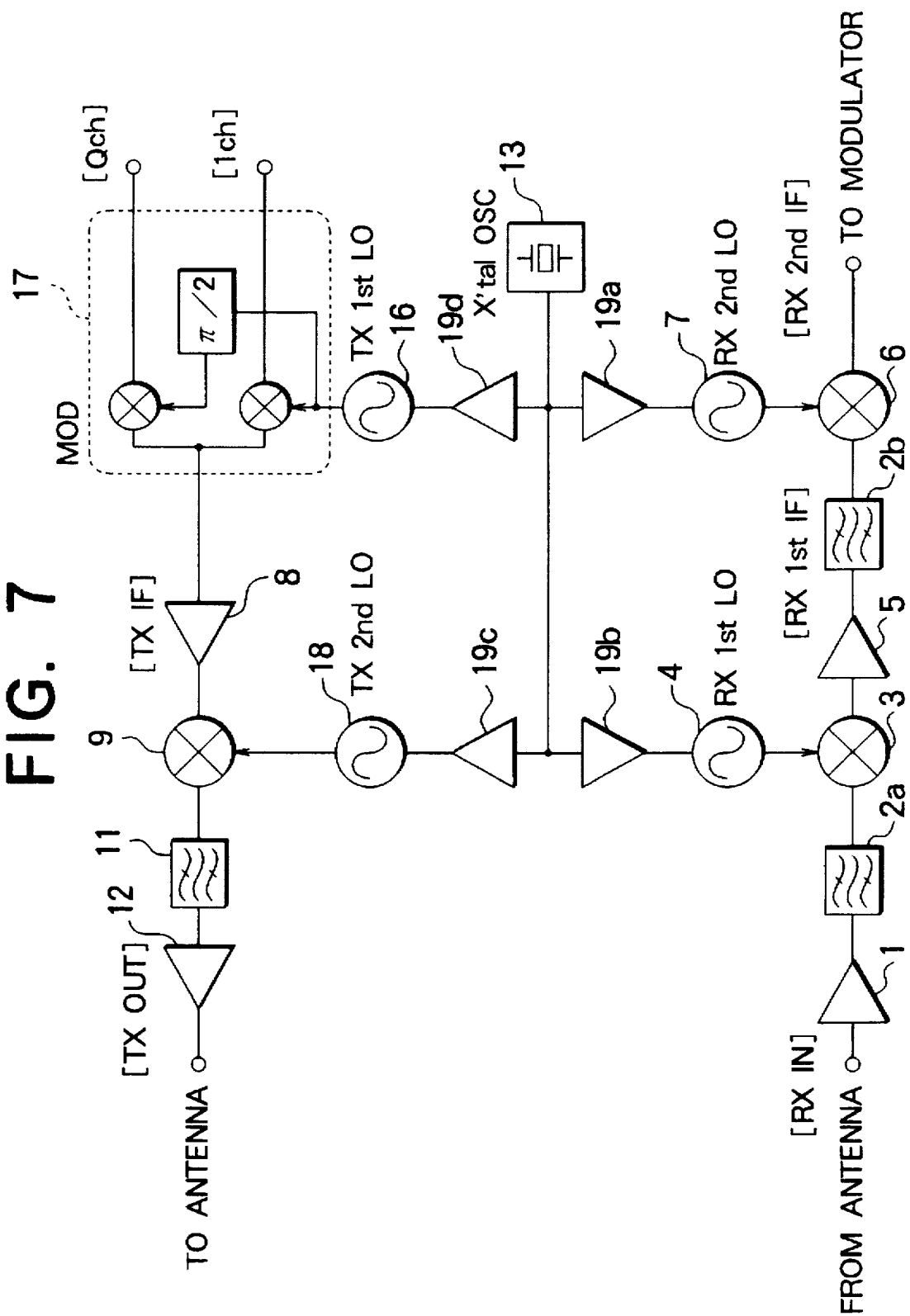
FIG. 7 is a schematic diagram illustrating the construction of a transmitter-receiver according to Embodiment 6.

A description will now be given by way of FIG. 7 with respect to the transmitter-receiver according to the invention as disclosed in Embodiment 6. Referring to FIG. 7, the portions identical or corresponding to those in FIG. 5 are denoted by the same reference numerals and description thereof will be omitted.

In the figure, denoted by numeral: 19a is a buffer amplifier connected to an output side of the quartz-crystal oscillator 13 and to an input side of the receiving second local oscillator 7; 19b is a buffer amplifier connected to the output side of the quartz-crystal oscillator 13 and to an input side of the receiving first local oscillator 4; 19c is a buffer amplifier connected to the output side of the quartz-crystal oscillator 13 and to an input side of the transmitting second local oscillator 18; and 19d is a buffer amplifier connected to the output side of the quartz-crystal oscillator 13 and to an input side of the transmitting first local oscillator 16.

Operation thereof will now be described.

The output of the common quartz-crystal oscillator 13 to be shared is supplied to the receiving second local oscillator 7 via the buffer amplifier 19a, to the receiving first local oscillator 4 via the buffer amplifier 19b, to the transmitting second local oscillator 18 via the buffer amplifier 19c, and to the transmitting first local oscillator 16 via the buffer amplifier 19d, respectively. The buffer amplifiers 19a, 19b, 19c and 19d amplify the signals respectively input thereto. The signals supplied to the respective local oscillators are processed similarly as in Embodiment 5.

While the respective local oscillators supply oscillating signals to a mixer, etc., in accordance with an output from the quartz-crystal oscillator, the signals from the mixer, etc., may cause the local oscillators to produce a backward leakage through the signal lines.

Since the buffer amplifiers 19a, 19b, 19c and 19d sufficiently damp such backwardly leaked signals by means of isolation thereof, a mutual interference between the circuits may be adequately suppressed.

While, in this embodiment, the buffer amplifiers are provided on the input sides of all the local oscillators, it is not limited to such and an advantage of suppressing a mutual interference between the circuits is achieved by providing one at the input side of any one of these.

Embodiment 7

A description will now be given by way of FIG. 8 with respect to the transmitter-receiver according to the invention as disclosed in Embodiment 7. Referring to FIG. 8, the portions identical or corresponding to those in FIGS. 4 and 7 are denoted by the same reference numerals and description thereof will be omitted.

The present invention is constructed such that a quasi-synchronization detector circuit is provided at the receiving frequency converter of Embodiment 6 to directly output a baseband signal.

Operation thereof will now be described.

The signal output from the quartz-crystal oscillator 13 is amplified by the input buffer amplifier 14a and is input to the receiving second local oscillator 7. The output from the receiving second local oscillator 7 is input to the quasi-synchronization detector circuit 15 and is branched thereat into one which is input to a mixer and the other which input to a mixer after a π/2 phase conversion. Baseband signals are then output from the respective mixers.

Since a signal having the transmitting intermediate frequency is directly modulated in the transmitting circuit and, in the receiving circuit, a signal having the receiving first intermediate frequency is directly output as the baseband, a transmitter-receiver may be achieved as having a small size and low cost.

Since, in the transmitter-receiver according to this invention, the transmitting local oscillator, transmitting circuit, receiving local oscillator and receiving circuit are controlled such that the frequencies of signals within the transmitting circuit and the frequencies of signals within the receiving circuit do not overlap each other, an interference of a signal within the transmitting circuit with the signal within the receiving circuit is mitigated and an interference of a signal in the receiving circuit with the signal within the transmitting circuit is also mitigated, thereby an advantage is achieved that the transmitter-receiver may be reduced in size and weight without causing such problems as deterioration in characteristic and spurious radiation. Further, since an oscillator is commonly shared by the transmitting circuit and the receiving circuit, spurious output due to an interference between the oscillators is eliminated.

In the transmitter-receiver according to this invention, since the transmitting local oscillator, transmitting circuit, receiving local oscillator and receiving circuit are controlled such that especially the transmitting image frequency of a signal within the transmitting circuit and the frequencies of signals within the receiving circuit do not overlap each other, an interference of a signal within the transmitting circuit with a signal within the receiving circuit is mitigated, thereby an advantage is achieved that the transmitter-receiver may be reduced in size and weight without causing such problems as deterioration in characteristic and spurious radiation.

In the transmitter-receiver according to this invention, since the transmitting local oscillator, transmitting circuit, receiving local oscillator and receiving circuit are controlled such that especially the receiving image frequency of a signal within the receiving circuit and the frequencies of signals within the transmitting circuit do not overlap each other, an interference of a signal within the receiving circuit with a signal within the transmitting circuit is mitigated, thereby an advantage is achieved that the transmitter-receiver may be reduced in size and weight without causing such problems as deterioration in characteristic and spurious radiation.

In the transmitter-receiver according to this invention, a signal leaking from the transmitting local oscillator to the receiving local oscillator or from the receiving local oscillator to the transmitting local oscillator is damped by damping means for damping a leakage signal provided between the transmitting local oscillator and the receiving local oscillator, thereby mitigating an interference between the transmitting circuit and the receiving circuit, achieving an advantage that the transmitter-receiver may be reduced in size and weight without causing such problems as deterioration in characteristic and spurious radiation. Further, since an oscillator is commonly shared by the transmitting circuit and the receiving circuit, spurious output due to an interference between the oscillators is eliminated.

What is claimed is:

1. A transmitter-receiver comprising:

a transmitting local oscillator for generating a transmitting oscillation signal having a transmitting local oscillating frequency based on a reference signal;

a transmitting circuit for providing an output by converting frequency of a transmitted signal input thereto in accordance with said transmitting oscillation signal;

a receiving local oscillator for generating a receiving oscillation signal having a receiving local oscillating frequency based on said reference signal;

a receiving circuit for providing an output by converting a frequency of a received signal input thereto in accordance with said receiving oscillation signal;

a reference signal oscillator provided as a common reference signal source for supplying said reference signal to said transmitting local oscillator and to said receiving local oscillator;

wherein a frequency arrangement of said transmitting local oscillating frequency, frequency of signals existing within said transmitting circuit, said receiving local oscillating frequency and frequency of signals existing within said receiving circuit being set such that the frequencies of the signals existing within the transmitter-receiver avoid overlapping one another;

wherein said transmitting circuit comprises: a transmitting intermediate amplifier for amplifying a transmitted signal input as having a transmitting intermediate frequency; a transmitting mixer for providing an output by mixing an output from the transmitting intermediate amplifier and an output of said transmitting local oscillator to effect a frequency conversion thereof from the transmitting intermediate frequency to a predetermined transmitting frequency; a transmitting band-pass filter for removing unnecessary wave components from the output of the transmitting mixer; and a transmitting power amplifier for amplifying an output of the transmitting band-pass filter and delivering it to an antenna;

wherein said receiving local oscillator comprises: a receiving first local oscillator for generating a receiving oscillation signal having a receiving first local oscillating frequency based on said reference signal; and a receiving second local oscillator for generating a receiving oscillation signal having a receiving second local oscillating frequency based on said reference signal; and wherein said receiving circuit comprises: a low-noise amplifier for amplifying a received wave input from an antenna; a receiving first band-pass filter for removing unnecessary wave components from an output of the low-noise amplifier; a receiving first mixer for mixing an output of the receiving first band-pass filter and the output of said receiving first local oscillator to provide an output by converting the receiving frequency into a receiving first intermediate frequency; a receiving first intermediate amplifier for amplifying the output of the receiving first mixer; a receiving second band-pass filter for removing unnecessary wave components from an output of the receiving first intermediate amplifier; and a receiving second mixer means for mixing an output of the receiving second band-pass filter and an output of said receiving second local oscillator to provide an output by converting the receiving first intermediate frequency into a receiving second intermediate frequency; further comprising damping means for damping a leakage signal provided between said transmitting local oscillator and said receiving first and second local oscillators, wherein buffer means are provided as said damping means respectively between said reference signal oscillator and said transmitting local oscillator, between said reference signal oscillator and said receiving first local oscillator, and between said reference signal oscillator and said receiving second local oscillator.

2. The transmitter-receiver according to claim 1 wherein a buffer amplifier is used as said buffer means.

3. The transmitter-receiver according to claim 1 wherein an isolator is used as said buffer means.

4. The transmitter-receiver according to claim 2 wherein a quasi-synchronization detector circuit is used as said receiving second mixer means.

5. The transmitter receiver according to claim 2 wherein, while a transmitting local oscillator for outputting a transmitting oscillation signal to said transmitting mixer is provided as a transmitting second local oscillator, a transmitting first local oscillator having a transmitting local oscillating frequency different from the transmitting second local oscillator is provided as said transmitting local oscillator; and further comprising an orthogonal converter receiving an output of the transmitting first local oscillator and a baseband signal for outputting a transmitted signal having a modulated intermediate frequency to said transmitting intermediate amplifier.

6. The transmitter-receiver according to claim 5 wherein a buffer amplifier is provided between said reference signal oscillator and said transmitting first local oscillator.

7. The transmitter receiver according to claim 5 wherein a quasi-synchronization detector circuit is used as said receiving second mixer means.

* * * * *